United States Patent
Takeda et al.

(10) Patent No.: US 6,610,581 B1
(45) Date of Patent: Aug. 26, 2003

(54) METHOD OF FORMING ISOLATION FILM IN SEMICONDUCTOR DEVICE

(75) Inventors: Yasuhiro Takeda, Ogaki; Hideaki Fujiwara, Hashima, both of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 74 days.

(21) Appl. No.: 09/584,850

(22) Filed: Jun. 1, 2000

(30) Foreign Application Priority Data

Jun. 1, 1999 (JP) .......................................... 11-154105

(51) Int. Cl.[7] ..................... H01L 21/8238; H01L 21/76; H01L 21/3205
(52) U.S. Cl. ..................... 438/439; 438/444; 438/225; 438/452; 438/227; 438/228; 438/585
(58) Field of Search ................................ 438/226, 225, 438/452, 227, 228, 439, 449, 585

(56) References Cited

U.S. PATENT DOCUMENTS 5,877,073 A * 3/1999 Mao et al. .................. 438/585
5,972,775 A * 10/1999 Chen .......................... 438/439
5,972,778 A * 10/1999 Hamada ..................... 483/444

(List continued on next page.)

FOREIGN PATENT DOCUMENTS

| JP | 59-041851 | | 3/1984 |
| JP | 60-074640 | | 4/1985 |
| JP | 60-098640 | | 6/1985 |
| JP | 3-159240 | | 7/1991 |
| JP | 404297063 A | * | 10/1992 |
| JP | 404340745 A | * | 11/1992 |
| JP | 405047921 A | * | 2/1993 |
| JP | 405182958 A | * | 7/1993 |
| JP | 405335302 A | * | 12/1993 |
| JP | 406029263 A | * | 2/1994 |
| JP | 406151418 A | * | 5/1994 |
| JP | 9-330923 | | 12/1997 |
| JP | 10-050690 | | 2/1998 |

OTHER PUBLICATIONS

T. Sheng et al., "From " "White Ribbon" to "Black Belt": A Direct Observation of the Kooi Effect Masking Film by Transmission Electron Microscopy, J. Electrochem, Soc., vol. 140, No. 11, 1993, pp. L163–L165.

E. Kooi et al., "Formation of Silicon Nitride at a Si–siO$_2$ Interface During Local Oxidation of Silicon and During Heat–Treatment of Oxidized Silicon in NH$_3$ Gas," J. Electrochem. Soc., vol. 123, No. 7, 1975, pp. 1117–1120.

Kiyoo Ito "Advanced Electronics Series I–9 VLSI Memory" Nov. 5, 1994, p. 10 (No translation –See Japanese Office Action).

"Advanced Electronics Series I–9 VLSI Memory" by Kiyoo ITO, Baifukan, Nov. 5, 1994, p. 10.

*Primary Examiner*—Matthew Smith
*Assistant Examiner*—Chuong Anh Luu
(74) *Attorney, Agent, or Firm*—Armstrong, Westerman & Hattori, LLP

(57) ABSTRACT

There is disclosed a method of forming an isolation film in a semiconductor device, the method including the steps of: forming a silicon oxide film and a silicon nitride film in that order on a silicon substrate, using a resist pattern as a mask, etching the silicon nitride film and silicon oxide film, and forming trenches in the substrate. In the substrate, the respective trenches form a region in which isolation films are to be formed, and the region between the trenches forms an active region. In this case, each dimension is set so that a ratio W/t of width W to thickness t of the patterned silicon nitride film is 3.8 or more. Subsequently, by removing the resist pattern, subsequently using the silicon nitride film as the mask, and performing thermal oxidation at a temperature of 1050° C. to 1150° C. in an oxygen atmosphere, an isolation film is formed in the trench.

9 Claims, 5 Drawing Sheets

U.S. PATENT DOCUMENTS

| | | | |
|---|---|---|---|
| 6,054,368 A * | 4/2000 | Yoo et al. | 438/450 |
| 6,153,482 A * | 11/2000 | Su et al. | 438/297 |
| 6,169,011 B1 * | 1/2001 | Teng Hsu | 438/424 |
| 6,184,106 B1 * | 2/2001 | Chung | 438/425 |
| 6,187,640 B1 * | 2/2001 | Shimada et al. | 438/297 |
| 6,207,505 B1 * | 3/2001 | Wu | 438/264 |
| 6,214,700 B1 * | 4/2001 | Ohashi et al. | 438/450 |
| 6,221,731 B1 * | 4/2001 | Peng et al. | 438/400 |
| 6,265,286 B1 * | 7/2001 | Boyer et al. | 438/443 |
| 6,268,266 B1 * | 7/2001 | Hwang et al. | 438/439 |
| 6,268,267 B1 * | 7/2001 | Lin | 438/439 |
| 6,268,268 B1 * | 7/2001 | Tokushige | 438/439 |
| 6,306,726 B1 * | 10/2001 | Kwok | 438/439 |

* cited by examiner

METHOD OF FORMING ISOLATION FILM IN SEMICONDUCTOR DEVICE

BACKGROUND OF THE INVENTION

Field of the Invention

The present invention relates to a method of manufacturing a semiconductor device, particularly to a method of forming an isolation film.

In recent years, there has been an increasing demand for the miniaturization of an isolation film with the high integration and high densification of an ultra large scale integrated circuit (ULSI). A selective oxidation method (Local Oxidation of Silicon, hereinafter referred to as LOCOS method) has been used in a conventional isolation technique, but in the LOCOS method, an isolation part necessarily rises because of volume expansion during oxidation, and flatness of the substrate surface is remarkably deteriorated. Therefore, when a semiconductor element is formed in the active region of a semiconductor substrate, there is a problem that the film thickness formed by photolithography fails to be uniform and fine working becomes difficult.

In order to solve -this problem, a technique is proposed to etch a shallow trench in a region to which an isolation film is to be formed in a silicon substrate, and form the isolation film by oxidation by the LOCOS method so that unevenness of the substrate surface caused by oxidation is reduced. This technique is called the recessed LOCOS method, and is disclosed, for example, in Japanese Patent Application Laid-Open No. 88092311997.

When the conventional recessed LOCOS method is used to manufacture a miniaturized semiconductor device, the following problem occurs. As shown in FIG. 5, a (111) crystal face (facet) 55 of silicon as substrate material 54 appears in the vicinity of the boundary between region 52 of isolation film 51 and an active region 53, and an oxidation inhibiting layer 58 called a white ribbon is generated in the vicinity of the tip end of a bird's beak 57. The reason for appearance of the silicon (111) crystal face is considered as follows: As the edge of the isolation region 52 adjacent to the active region 53 is covered with a thick silicon nitride film Q to prevent oxidation of the active region 58, volume expansion accompanying oxidation is not permitted, and therefore the oxidation speed is reduced and the silicon (111) crystal face inherently having a high oxidation speed appears. Since no oxidation occurs even in the presence of oxidation species, the silicon (111) crystal face remains. Moreover, the white ribbon is considered to be formed when part of the silicon nitride film Q is oxidized by the oxidation species to generate ammonia, and the ammonia causes nitriding of the substrate material of silicon.

In order to form the gate dielectric film in the active region 53, as shown in FIG. 61 the silicon nitride film Q is removed by etchings the active region 53 is then thermally oxidized, and an oxide film called a sacrificial oxide film is formed in the active region 53. The oxidation of the active region 53 in the vicinity of bird's beak 57 is inhibited by the white ribbon. Therefore, a protrusion is formed in the region where the white ribbon existed. The protrusion is connected to the (111) crystal face, and a steep corner part 56 is therefore formed. As a result, the following problems occur.

(1) For the gate oxide film formed in the active region 53, no uniform oxidation occurs in the corner part 56, the oxide film of the part becomes thin, causing deteriorated withstand voltage of the gate oxide film.

(2) When MOS transistor structure is formed such that the gate electrode formed in the active region rides on the isolation film 51, and electric field is concentrated in the corner part 56, the gate threshold voltage in the part with a small gate width drops, and leakage easily occurs during actual use.

SUMMARY OF THE INVENTION

Wherefore, it is an object of the present invention to provide a method of manufacturing a semiconductor device which is miniaturized but is provided with a superior isolation structure.

To attain this and other objects, according to the present invention, there is provided a semiconductor device manufacturing method which includes the steps of: forming at least two trenches in a semiconductor substrate to form an active region; covering the active region with a non-oxidizable mask; and oxidizing the is trench to form an isolation film. In this method, a ratio W/t of width W to thickness t of the non-oxidizable mask is set at 3.8 or higher.

Since the non-oxidizable mask is easily elastically deformed during the oxidation of the trench by setting the ratio Wit of width W to thickness t of the non-oxidizable mask to 3.8 or more as described above, no (111) crystal face (facet) of silicon appears in the vicinity of the boundary between the isolation film forming region and the active region, and the boundary part between the active region and the isolation film forming region is substantially rounded. As a result, the corner part of the boundary between the active region and the isolation film forming region does not become steep, Moreover, in this case, when active regions with different widths are formed on the substrate, the thickness of the non-oxidizable mask formed on the active region with a small width is preferably less than the thickness of the non-oxidizable mask formed on the active region with a large width. This can reduce the stress imposed on the active region with the small width, by the non-oxidizable mask formed on the active region.

Additionally, the temperature of oxidation is preferably set to 1050° C. or more, but preferably in a range of 1050° C. to 1150° C., considering the operation efficiency of a furnace. The action of the present invention can therefore be obtained reliably, Moreover, it is preferable to form a buffer layer under the non-oxidizable mask before oxidizing the trench. This can relax the stress imposed on the substrate by the non-oxidizable mask when the trench is oxidized.

BRIEF DESCRIPTION THE DRAWINGS

Embodiments of the present invention will be described hereinafter with reference to the drawings, in which.

DETAILED DESCRIPTION PREFERRED EMBODIMENTS

First Embodiment

Figure 1:
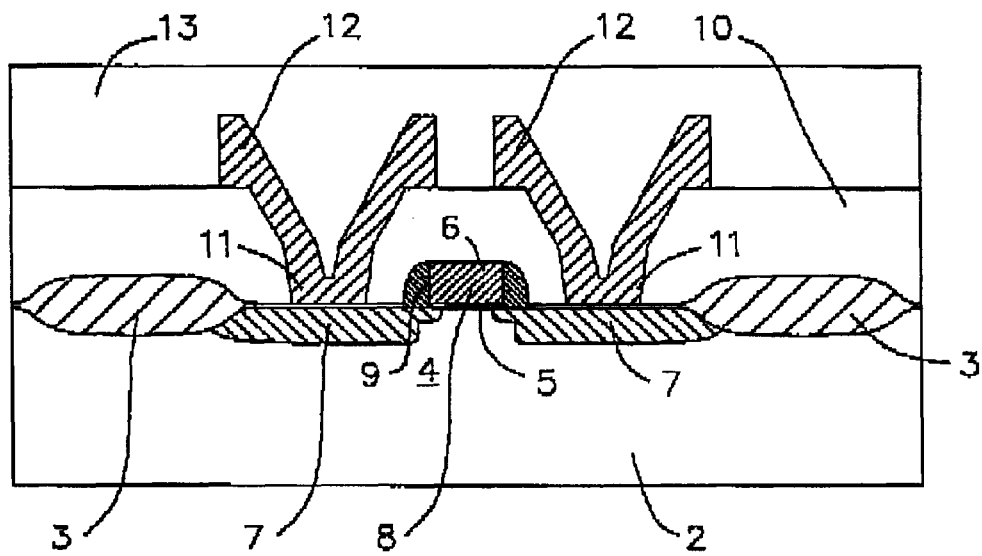
FIG. 1 is a schematic sectional view of a semiconductor device according to a first embodiment of the present invention.

FIG. 1 shows a sectional view of a semiconductor device 1 in a first embodiment. In FIG. 1, an active region 4 is divisionally formed by isolation films 3 on a p-type monocrystal silicon substrate 2. An MOS transistor 8 with a lightly doped drain (LDD) structure which includes a gate oxide film 5, a gate electrode 6 and source/drain regions 7 is formed in the active region 4. A side wall spacer 9 is formed on the side wall of the gate electrode 6.

An interlayer isolation film 10 is formed on the entire surface of the substrate 2 including the MOS transistor 8 and isolation films 3, and aluminum electrode wirings 12 are connected to the source/drain regions 7, respectively, via contact holes 11 formed in the interlayer isolation film 10. The uppermost part of the substrate 2 is covered with a passivation film 13.

A method of manufacturing the semiconductor device 1 in the first embodiment will next be described with reference to sectional process views shown in FIGS. 1 and 2A to 2F.

Process 1 (see FIG. 2A): After using a thermal oxidationt method (e.g., dry oxidation in which a temperature of 950° C. is used) to form a silicon oxide film 12 with a thickness of 10 nm on the p-type monuocrystal silicon substrate 2, a CVD method (reduced pressure CVD functions as a buffer layer to relax the stress imposed on substrate 2 by silicon nitride film 13 during the oxidations Moreover, in the first embodiment, since the ratio W/t of width W to thickness t of the silicon nitride film 13 is set to 3.8 or more as described above, the silicon nitride film 13 is easily elastically deformed during the oxidation, and no silicon (111) crystal face (facet) appears in the vicinity of the boundary between the isolation film 5 and the active region 4. Therefore, in the silicon substrate 2, a corner part 2b of the boundary between the active region 4 and the isolation film 3 is substantially rounded and fails to steepen.

Figure 2A:
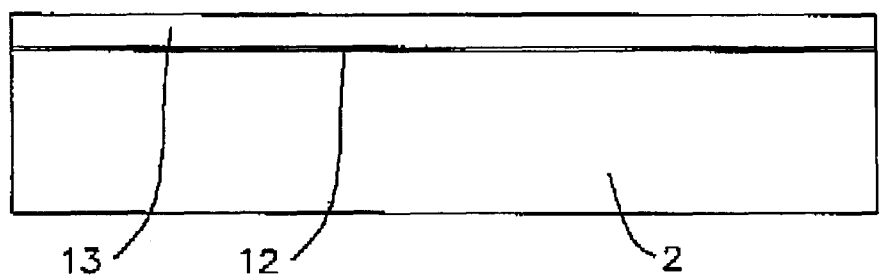
FIGS. 2A to 2F are schematic sectional views showing the manufacture process of the semiconductor device according to the first embodiment of the present invention.
Figure 2B:
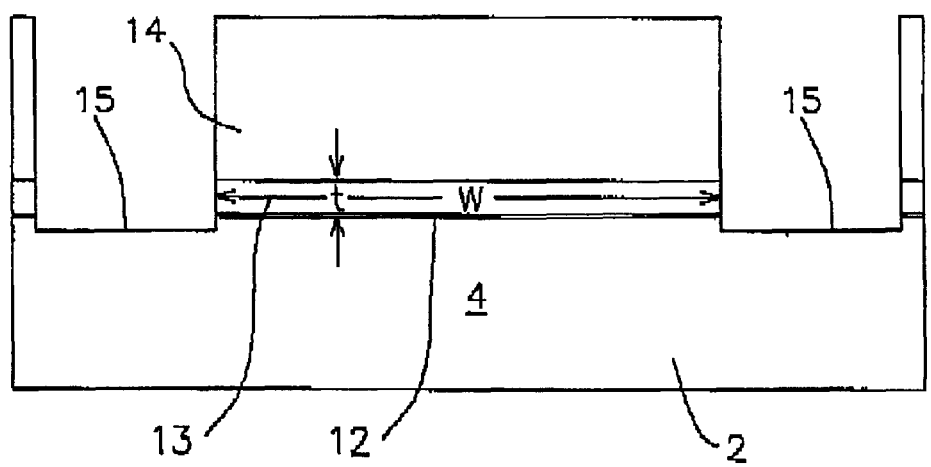
Figure 2C:
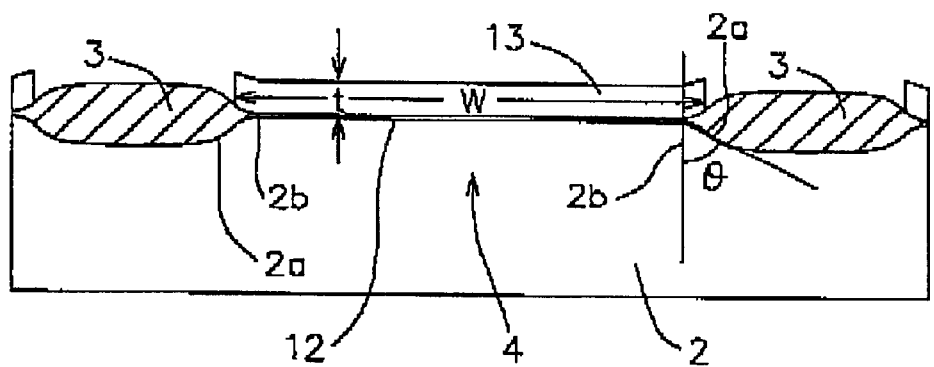
Figure 2D:
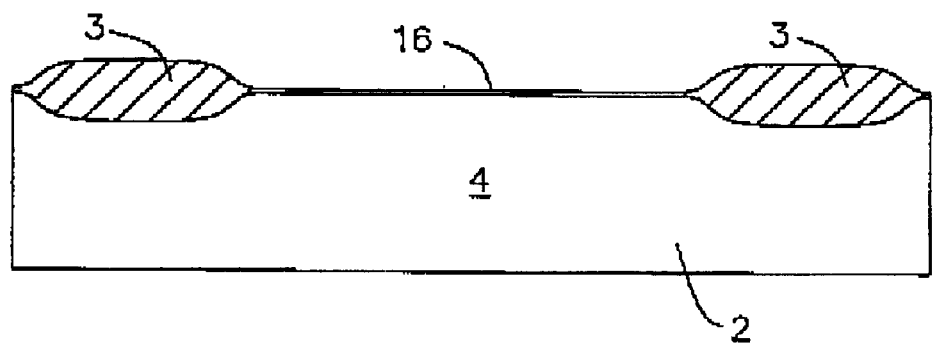
Figure 2E:
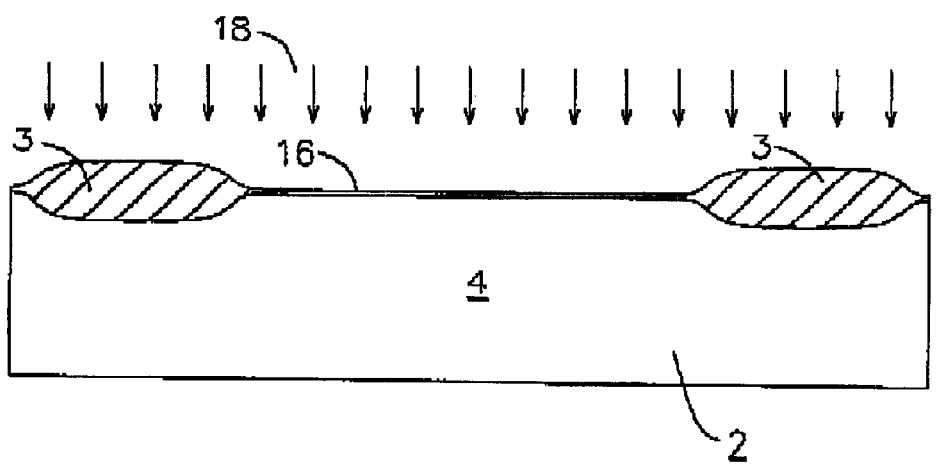
Figure 2F:
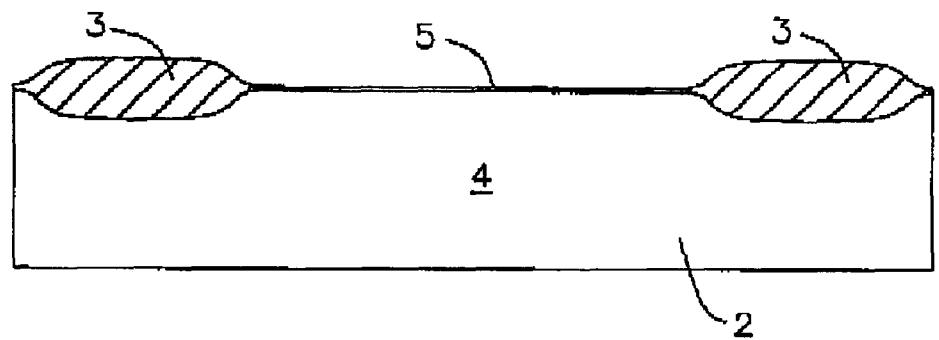

Table 1 shows the result obtained by measuring the angle θ of corner part 2b at the boundary between the active region 4 and isolation film 3 with respect to a vertical line while changing the ratio W/t of width W to thickness t of the silicon nitride film 13 in FIG. 2C. method, plasma CVD method, high density plasma CVD method or normal pressure CVD method) is used to form a silicon nitride film 13 on the silicon oxide film 12.

Process 2 (see FIG. 2B): After forming a resist pattern 14 on the silicon nitride film 13, resist pattern 14 is used as a mask, and by introducing and adjusting etching gas, etching the silicon nitride film 13 and silicon oxide film 12, and further etching the silicon substrate 2 by 50 nm, trenches 15 are formed in the substrate 2. In substrate 2, the respective trenches 15 form a region in which isolation films are to be formed, and a region located between the trenches 15 forms the active region 4. In this case, dimensions are set so that the ratio W/t of width W to thickness t of the patterned silicon nitride film 13 is 3.8 or more. Specifically, the width W of the silicon nitride film 13 is set to 500 nm, and the film thickness t is set to 180 nm.

Process 3 (see FIG. 2C): By removing resist pattern 14, and subsequently performing thermal oxidation at a temperature range of 1050° C. to 1150° C. in an oxygen atmosphere, isolation film 3 with a thickness of 350 nm is formed in the trench 15. In this case, since the silicon nitride film 13 functions as a non-oxidizable mask, the active region 4 covered with the silicon nitride film 13 is not oxidized. Moreover, the silicon oxide film 12

TABLE 1

| W/t | θ (degree) |
|---|---|
| 2.667 | 35.0 |
| 2.857 | 36.5 |

TABLE 1-continued

| W/t | θ (degree) |
|---|---|
| 3.333 | 36.0 |
| 3.571 | 38.0 |
| 3.800 | 50.0 |
| 4.000 | 60.0 |
| 4.167 | 68.0 |
| 6.667 | 70.0 |

When the silicon (111) crystal face (facet) appears on inclined face 2a of the silicon substrate 2 in the vicinity of the boundary between isolation film 3 and active region 4, the indicated angle e is 34.5 degrees, and with a ratio W/t of less than 3.8, the angle substantially approaches the facet. On the other hand, when the ratio W/t is set to 3.8 or higher, the angle θ suddenly increases. Specifically, it is seen that corner part 2b of the boundary between active region 4 and the isolation film 3 is substantially rounded and fails to steepen.

Figure 4:
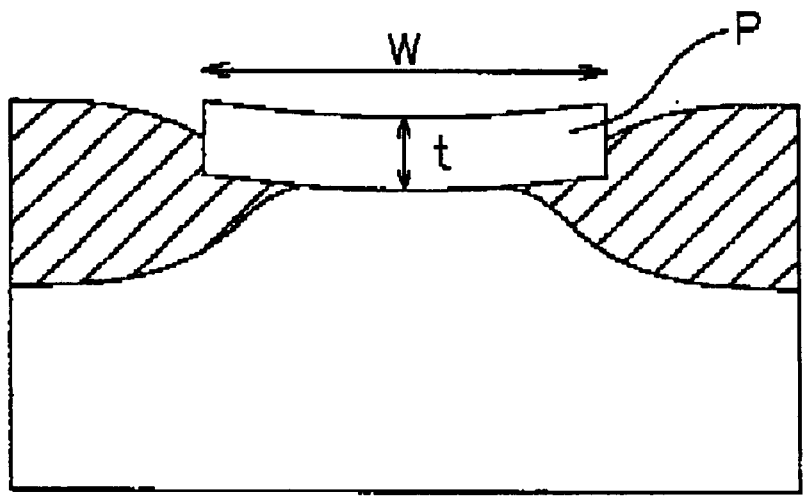
FIG. 4 is a schematic sectional view of the semiconductor device showing the principle of the present invention.
Figure 5:
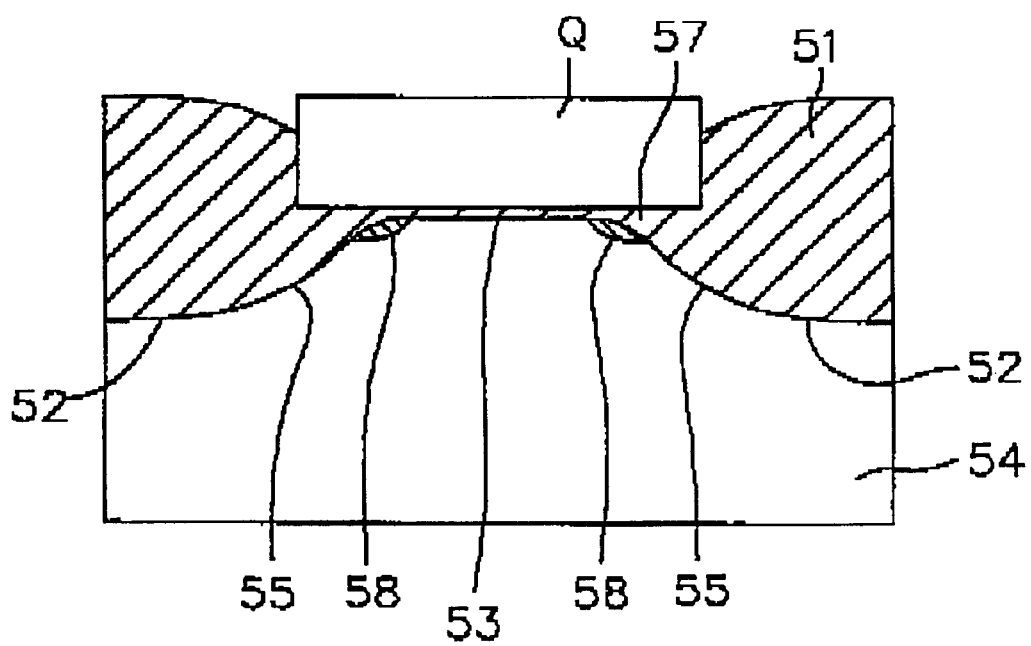
FIGS. 5 and 6 are main part enlarged sectional views of the semiconductor device showing the problem of a conventional semiconductor manufacture method.
Figure 6:
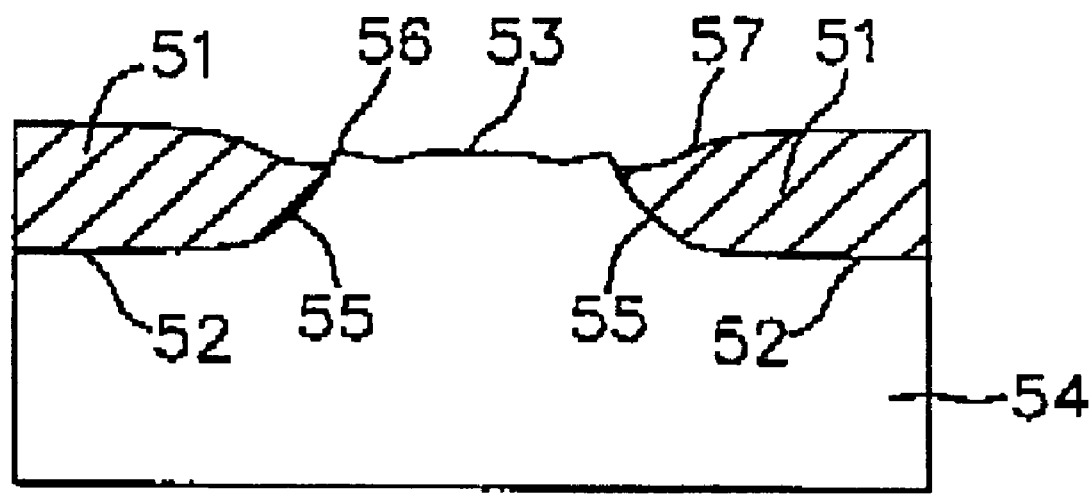

As shown in FIG. 4, in the present invention, since a film P of non-oxidizable mask is shaped to obtain the width W/thickness t of 3.8 or more, the film P of the non-oxidizable mask is elastic such that the film is deformed in accordance with volume expansion during oxidation of a semiconductor material. Therefore, differing from the conventional example, Since volume expansion is permitted, neither a silicon (111) crystal face nor a steep corner part is generated.

Process 4 (see FIGS. 2C and 2D): A 150° C. to 160° C. hot phosphoric acid solution is used to remnove the silicon nitride film 18. Furthermore, by removing the silicon oxide film 12 and thermally oxidizing the surface of the substrate 2, a sacrificial oxide film 16 is formed in the active region 4. In this case, since the forming temperature of the isolation film 3 is set in the range of 1050° C. to 1150° C. in process a 3, an oxidation inhibiting layer such as the white ribbon is not formed in the periphery of isolation film a. Therefore, no recess/protrusion attributed to the oxidation inhibiting layer is generated on the surface of active region 4.

Process 5 (see FIG. 2E): An impurity ion 18 for forming a well and adjusting a threshold voltage is implanted into substrate 2 through sacrificial oxide film 16.

Process 6 (see FIG. 2F): After removing sacrificial oxide film 16, the thermal oxidation method is again used to form the gate oxide film 5 on the surface of substrate 2. In this case, since corner part 2b at the boundary between active region 4 and isolation film 3 is substantially rounded and is not steepened in the silicon substrate 2 as described above, oxidation is performed relatively uniformly even in corner part 2b, and the thickness of gate oxide film 5 in this part is prevented from becoming particularly thin.

Process 7 (see FIG. 1): The conventional known technique is used to form the MOS transistor 8 of the LDD structure including the gate oxide film 5, gate electrode 6 and source/drain regions 7 in active region 4.

Subsequently, after forming the interlayer isolation film 10 of the silicon oxide film on the entire surface of the substrate 2 including the MOS transistor 8 and isolation film 3, and forming the contact holes 11 in interlayer isolation film 10, the aluminum electrode wirings 12 are connected to the source/drain regions 7 via the contact holes 11, respectively.

As described, in the first embodiment above, since corner part 2b of the boundary between active region 4 and isolation film 3 is substantially rounded and fails to steepen in silicon substrate 2, oxidation is relatively uniformly performed even in corner part 2b, and the thickness of gate oxide film 5 in this part is prevented from being particularly thin.

Therefore, defective pressure resistance of gate oxide film 5 can be prevented from accidentally occurring, and the reliability of the semiconductor device 1 can be enhanced.

Moreover, as not shown in the first embodiment, even when the structure of the MOS transistor 8 is formed so that the gate electrode 6 extends to the upper part of isolation film 3, the electric field is inhibited from concentrating in corner part 2b, and reduction of the gate threshold voltage in the part with the small gate width is prevented.

Second Embodiment

Figure 3A:
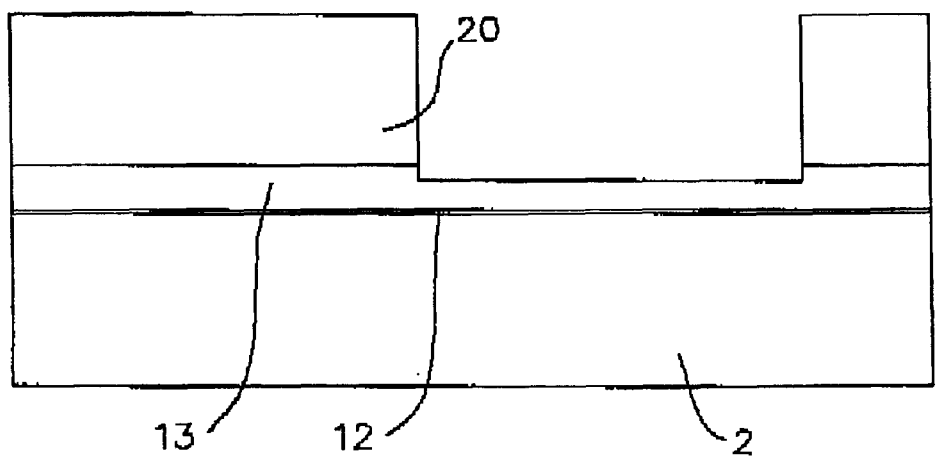
FIGS. 3A and 3B are schematic sectional views showing the manufacture process of the semiconductor device according to a second embodiment of the present invention.

A second embodiment of the present invention will be described with reference to the drawings. The second embodiment is different from the first embodiment only in process 2, the other processes remaining the same. Therefore, only the process corresponding to above-described process 2 will be described with reference to the sectional process views of FIGS. 3A and 3B.

Process 2a (see FIG. 3A): This part is formed into a thin film by forming a resist pattern 20 on the silicon nitride film 13, subsequently using the resist pattern 20 as the mask, and partially etching the silicon nitride film 13.

Figure 3B:
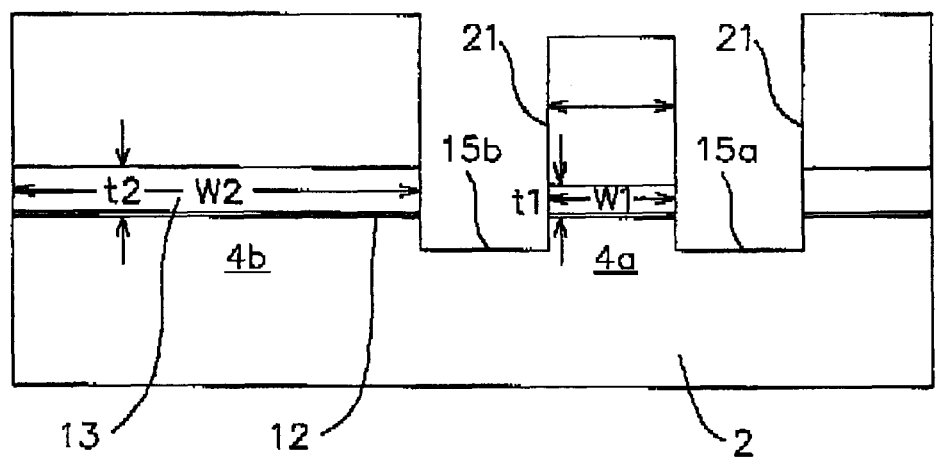

Process 2b (see FIG. 3B); Trenches 15a, 15b are formed in substrate 2 by removing the resist pattern 20, subsequently forming a resist pattern 21 again on the silicon nitride film 13, using this resist pattern 21 as the mask, introducing and adjusting the etching gas, etching the silicon nitride film 13 and silicon oxide film 12, and further etching the silicon substrate 2 by 50 nm.

Moreover, in the second embodiment, a narrow active region. 4a and a wide active region 4b are divisionally formed by the respective trenches 15a and 15b on substrate 2, and narrow active region 4a appears where the silicon nitride film 13 is formed into the thin film in process 2a above.

Specifically, in the second embodiment, the thickness of silicon nitride film 18 as the non-oxidizable mask for covering the narrow active region 4a is set to be smaller than the thickness of the silicon nitride film 13 as the non-oxidizable mask for covering the wide active region 4b. Specifically, for silicon nitride film 13 in the narrow active region 4a, a width W1 is set at 350 nm and a film thickness t1 is set at 90 nm, and for the silicon nitride film is in the wide active region 4b, a width W2 is set at 1000 nm and a film thickness t2 is set at 150 nm.

In the narrow active region 4a, since the aspect ratio W/t of the non-oxidizable mask section is reduced, and the non-oxidizable mask itself cannot be easily elastically deformed, the silicon nitride film 13, as a non-oxidizable mask, imposes a large stress on the silicon substrate 2. In the second embodiment, however, the thickness of the silicon nitride film 13 is adjusted in accordance with the width of active region 4 within the range in which the ratio Wit of width W to thickness t of the silicon nitride film 13 is 3.8 or more, and the action/effect of the first embodiment can be obtained more easily, It is considered that a thin non-oxidizable mask be used, regardless of the width of the active region, to increase the ratio Wit. In this case, however, a problem occurs that the bird's beak is enlarged in the wide active region. There is no such problem according to the second embodiment, since the optimum ratio Wit is employed in accordance with the size of the active region.

The present invention is not limited to the aforementioned embodiments and can variously be modified.

What is claimed is:

1. A method of manufacturing a semiconductor device, comprising the steps of:

forming at least two trenches in a semiconductor substrate;

forming an active region between said trenches;

covering said active region with a non-oxidizable mask of width W and thickness t; and oxidizing said trenches to form isolation films;

wherein a ratio W/t of width W to thickness t of said non-oxidizable mask is within the range from 3.8 to 6.667.

2. The method of manufacturing a semiconductor device according to claim 1, wherein a plurality of active regions with different widths are formed on said substrate, and the thickness of the non-oxidizable mask formed on the active region with a small width is smaller than the thickness of the non-oxidizable mask formed on the active region with a large width.

3. The method of manufacturing a semiconductor device according to claim 1, wherein the temperature range of said oxidation is 1050° C. to 1150° C.

4. The method of manufacturing a semiconductor device according to claim 1, wherein a buffer layer is formed under said non-oxidizable mask before said trench is oxidized.

5. A method of manufacturing a semiconductor device, comprising the steps of:

forming at least two trenches in a semiconductor substrate to form an active region between said trenches;

covering said active region with a silicon nitride film of width W and thickness t; and oxidizing said trenches to form isolation films;

wherein a ratio W/t of width W to thickness t of said silicon nitride film is at least 3.8.

6. The method of manufacturing a semiconductor device according to claim 5, wherein the temperature of said oxidation is 1050° C. to 1150° C.

7. A method of manufacturing a semiconductor device, comprising the steps of:

forming an oxide film on a semiconductor substrate;

forming a non-oxidizable mask on said oxide film of width W and thickness t;

forming at least two trenches through both said non-oxidizable mask and said oxide film, and into said semiconductor substrate to form an active region between said trenches; and oxidizing said trenches to form an isolation film;

wherein a ratio W/t of width W to thickness t of said non-oxidizable mask is at least 3.8.

8. The method of manufacturing a semiconductor device according to claim 7, wherein the temperature range of said oxidation is 1050° C. to 1150° C.

9. A method of manufacturing a semiconductor device, comprising the steps of:

forming an oxide film on a semiconductor substrate;

forming a non-oxidizable mask on said oxide film;

etching a part of said non-oxidizable mask to form a thin film;

forming at least two trenches, partially etching said non-oxidizable mask, said oxide film and said semiconductor substrate so that said thin film of said non-oxidizable mask is present between said trenches, defining a first active region with a small width by the thin film, and defining a second active region with a large width as that other than the thin film; and oxidizing said trenches to form isolation films;

wherein a ratio W/t of width W to thickness t of said non-oxidizable mask in said first active region is at least 3.8.

* * * * *